(12) United States Patent
Koutny, Jr. et al.

(10) Patent No.: US 6,566,249 B1
(45) Date of Patent: May 20, 2003

(54) PLANARIZED SEMICONDUCTOR INTERCONNECT TOPOGRAPHY AND METHOD FOR POLISHING A METAL LAYER TO FORM WIDE INTERCONNECT STRUCTURES

(75) Inventors: William W. C. Koutny, Jr., Santa Clara, CA (US); Anantha R. Sethuraman, Fremont, CA (US); Christopher A. Seams, Pleasanton, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/189,411

(22) Filed: Nov. 9, 1998

(51) Int. Cl.$^7$ .......................................... H01L 21/4763
(52) U.S. Cl. ...................... 438/637; 438/303; 438/692; 438/706
(58) Field of Search ................................ 438/637, 633, 438/303, 692, 627, 628, 674, 706; 430/313, 317; 257/522, 758

(56) References Cited

U.S. PATENT DOCUMENTS

| | | | |
|---|---|---|---|
| 3,629,023 A | 12/1971 | Strehlow | |
| 3,979,239 A | 9/1976 | Walsh | |
| 4,010,583 A | 3/1977 | Highberg | |
| 4,193,226 A | 3/1980 | Gill, Jr. et al. | |
| 4,256,535 A | 3/1981 | Banks | |
| 4,261,791 A | 4/1981 | Shwartzman | |
| 4,373,991 A | 2/1983 | Banks | |
| 4,393,628 A | 7/1983 | Ottman et al. | |
| 4,505,720 A | 3/1985 | Gabor et al. | |
| 4,600,469 A | 7/1986 | Fusco et al. | |
| 4,677,043 A | 6/1987 | Cordes, III et al. | |
| 4,768,883 A | 9/1988 | Waldo et al. | |

(List continued on next page.)

OTHER PUBLICATIONS

Malkoe et al., "Effect of Retaining Ring System on the Polishing of 300 mm Oxide–Wafers," Mar. 2001, pp. 519–522.

Wolf, *Silicon Processing for the VLSI Era vol. 2: Process Integration*, Lattice Press 1990, pp. 189–191.

Singer, "CMP Developers Take Aim at STI Applications" and "Slurry–Free CMP Reduces Dishing, Speeds Process," *Semiconductor International*, Feb. 1998, vol. 21, No. 2, p. 40.

Singer, "CMP Developers Take Aim at STI Applications" and "Slurry–Free CMP Reduces Dishing, Speeds Process," *Semiconductor International*, vol. 21, No. 2, p. 40.

Ali et al., "Chemical–Mechanical Polishing of Interlayer Dielectric: A Review," *Solid State Technology*, Oct. 1994, pp. 63–68.

Sivaram et al., "Developments in Consumables Used in the Chemical Mechanical Polishing of Dielectrics," *International Conference on Solid State Devices & Materials*, Aug. 1995, p. 166.

*Primary Examiner*—Matthew Smith
*Assistant Examiner*—Igwe U. Anya
(74) *Attorney, Agent, or Firm*—Kevin L. Daffer; Conley, Rose P.C.

(57) ABSTRACT

The present invention advantageously provides a substantially planarized semiconductor topography and method for making the same by selectively etching a dielectric layer to form a plurality of posts surrounded by trenches. The trenches are filled with a conductive material, such as a metal, deposited to a level spaced above the upper surfaces of the dielectric layer and the posts. The surface of the conductive material is then polished to a level substantially coplanar with the upper surfaces of the dielectric layer and the posts. Advantageously, the polish rate of the conductive material above the trenches is substantially uniform. In this manner, the topological surface of the resulting interconnect level is substantially void of surface disparity.

18 Claims, 15 Drawing Sheets

U.S. PATENT DOCUMENTS

| | | |
|---|---|---|
| 4,778,532 A | 10/1988 | McConnell et al. |
| 4,789,648 A | 12/1988 | Chow et al. |
| 4,811,522 A | 3/1989 | Gill, Jr. |
| 4,879,258 A | 11/1989 | Fisher |
| 4,933,715 A | 6/1990 | Yamada et al. |
| 4,944,836 A | 7/1990 | Beyer et al. |
| 4,954,141 A | 9/1990 | Takiyama et al. |
| 4,956,313 A | 9/1990 | Cote et al. |
| 4,962,423 A | 10/1990 | Yamada et al. |
| 4,968,381 A | 11/1990 | Prigge et al. |
| 4,986,878 A | 1/1991 | Malazgirt et al. |
| 5,032,203 A | 7/1991 | Doy et al. |
| 5,057,462 A | 10/1991 | Eisenberg et al. |
| 5,064,683 A | 11/1991 | Poon et al. |
| 5,084,419 A | 1/1992 | Sakao |
| 5,209,816 A | 5/1993 | Yu et al. |
| 5,262,354 A | 11/1993 | Cote et al. |
| 5,273,558 A | 12/1993 | Nelson et al. |
| 5,288,333 A | 2/1994 | Tanaka et al. |
| 5,312,777 A | 5/1994 | Cronin et al. |
| 5,320,706 A | 6/1994 | Blackwell |
| 5,320,978 A | 6/1994 | Hsu |
| 5,340,370 A | 8/1994 | Cadien et al. |
| 5,346,584 A | 9/1994 | Nasr et al. |
| 5,362,668 A | 11/1994 | Tasaka |
| 5,362,669 A | 11/1994 | Boyd et al. |
| 5,363,550 A | 11/1994 | Aitken et al. |
| 5,376,482 A | 12/1994 | Hwang et al. |
| 5,389,194 A | 2/1995 | Rostoker et al. |
| 5,389,579 A | 2/1995 | Wells |
| 5,392,361 A | 2/1995 | Imaizumi et al. |
| 5,395,801 A | 3/1995 | Doan et al. |
| 5,397,741 A | 3/1995 | O'connor et al. |
| 5,401,691 A | 3/1995 | Caldwell |
| 5,406,111 A | 4/1995 | Sun |
| 5,421,769 A | 6/1995 | Schultz et al. |
| 5,435,772 A | 7/1995 | Yu |
| 5,436,488 A | 7/1995 | Poon et al. |
| 5,441,094 A | 8/1995 | Pasch |
| 5,453,639 A | 9/1995 | Cronin et al. ............... 257/510 |
| 5,459,096 A | 10/1995 | Venkatesan et al. |
| 5,468,983 A | 11/1995 | Hirase et al. |
| 5,486,265 A | 1/1996 | Salugsugan |
| 5,492,858 A | 2/1996 | Bose et al. |
| 5,494,857 A | 2/1996 | Cooperman et al. |
| 5,503,962 A | 4/1996 | Caldwell |
| 5,525,840 A | 6/1996 | Tominaga |
| 5,531,861 A | 7/1996 | Yu et al. |
| 5,541,427 A | 7/1996 | Chappell et al. |
| 5,551,986 A | 9/1996 | Jain |
| 5,573,633 A | 11/1996 | Gambino et al. |
| 5,578,523 A | 11/1996 | Fiordalice et al. |
| 5,591,239 A | 1/1997 | Larson et al. |
| 5,595,937 A | 1/1997 | Mikagi |
| 5,602,423 A * | 2/1997 | Jain ........................... 257/752 |
| 5,607,345 A | 3/1997 | Barry et al. |
| 5,616,513 A | 4/1997 | Shepard |
| 5,629,242 A | 5/1997 | Nagashima et al. |
| 5,643,406 A | 7/1997 | Shimomura et al. |
| 5,643,823 A | 7/1997 | Ho et al. |
| 5,643,836 A | 7/1997 | Meister et al. |
| 5,652,176 A | 7/1997 | Maniar et al. |
| 5,656,097 A | 8/1997 | Olesen et al. |
| 5,664,990 A | 9/1997 | Adams et al. |
| 5,665,202 A | 9/1997 | Subramanian et al. |
| 5,666,985 A | 9/1997 | Smith, Jr. et al. |
| 5,676,587 A | 10/1997 | Landers et al. |
| 5,702,977 A | 12/1997 | Jang et al. |
| 5,721,172 A | 2/1998 | Jang et al. |
| 5,728,308 A | 3/1998 | Muroyama |
| 5,776,808 A | 7/1998 | Muller et al. |
| 5,782,675 A | 7/1998 | Southwick |
| 5,786,260 A | 7/1998 | Jang et al. |
| 5,837,612 A | 11/1998 | Ajuria et al. |
| 5,906,532 A | 5/1999 | Nakajima et al. |
| 5,919,082 A | 7/1999 | Walker et al. |
| 5,928,959 A | 7/1999 | Huckels et al. |
| 5,943,590 A | 8/1999 | Wang et al. |
| 5,952,687 A | 9/1999 | Kawakubo et al. |
| 5,963,841 A | 10/1999 | Karlsson et al. |
| 5,972,792 A | 10/1999 | Hudson |
| 6,010,964 A | 1/2000 | Glass |
| 6,016,000 A * | 1/2000 | Moslehi ..................... 257/522 |
| 6,042,996 A * | 3/2000 | Lin et al. .................... 430/313 |

* cited by examiner

PLANARIZED SEMICONDUCTOR INTERCONNECT TOPOGRAPHY AND METHOD FOR POLISHING A METAL LAYER TO FORM WIDE INTERCONNECT STRUCTURES

BACKGROUND OF THE INVENTION

1. Field of the Invention

This invention relates to integrated circuit manufacturing and, more particularly, to a substantially planarized interconnect topography and method for making substantially planarized electrically conductive features such as wide interconnect structures by fabricating the electrically conductive features around a plurality of posts.

2. Description of the Related Art

Fabrication of an integrated circuit involves numerous processing steps. After implant regions (e.g., source/drain regions) have been placed within a semiconductor substrate and gate areas defined upon the substrate, an interlevel dielectric is formed across the topography to isolate the gate areas and the implant regions from overlying conducting regions. Interconnect routing is then patterned across the interlevel dielectric and connected to the implant regions and/or the gate areas by ohmic contacts formed through the interlevel dielectric. Alternating levels of interlevel dielectric and interconnect may be placed across the semiconductor topography to form a multi-level integrated circuit.

As successive layers are deposited across previously patterned layers of an integrated circuit, elevational disparities develop across the surface of each layer. If left unattended, the elevational disparities in each level of an integrated circuit can lead to various problems. For example, when a dielectric, conductive, or semiconductive material is deposited over a topological surface having elevationally raised and recessed regions, step coverage problems may arise. Step coverage is defined as a measure of how well a film conforms over an underlying step and is expressed by the ratio of the minimum thickness of a film as it crosses a step to the nominal thickness of the film over horizontal regions. Also, stringers may arise from incomplete etching over severe steps. Furthermore, correctly patterning layers upon a topological surface containing fluctuations in elevation may be difficult using optical lithography. The depth-of-focus of the lithography alignment system may vary depending upon whether the resist resides in an elevational "hill" or "valley" area. The presence of such elevational disparities therefore makes it difficult to print high-resolution features.

Techniques involving chemical and mechanical abrasion (e.g., chemical-mechanical polishing) to planarize or remove the surface irregularities have grown in popularity. As shown in FIG. 1, a typical chemical-mechanical polishing ("CMP") process involves placing a semiconductor wafer 12 face-down on a polishing pad 14 which lies on or is attached to a rotatable table or platen 16. A popular polishing pad medium includes polyurethane or polyurethane-impregnated polyester felts. During the CMP process, polishing pad 14 and semiconductor wafer 12 may be rotated while a carrier 10 holding wafer 12 applies a downward force F upon polishing pad 14. An abrasive, fluid-based chemical suspension, often referred to as a "slurry", may be deposited from a conduit 18 positioned above pad 14 onto the surface of polishing pad 14. The slurry may fill the space between pad 14 and the surface of wafer 12. The polishing process may involve a chemical in the slurry reacting with the surface material being polished. The rotational movement of polishing pad 14 relative to wafer 12 preferably causes abrasive particles entrained within the slurry to physically strip the reacted surface material from wafer 12. The pad 14 itself may also physically remove some material from the surface of the wafer 12. The abrasive slurry particles are typically composed of silica, alumina, or ceria.

CMP is commonly used to form a planarized level of an integrated circuit containing interconnect laterally spaced from each other in what is generally referred to as the "damascene" process. Laterally spaced trenches are first etched in an interlevel dielectric configured upon a semiconductor topography comprising electrically conductive features. A conductive material is then deposited into the trenches and on the interlevel dielectric between trenches to a level spaced above the upper surface of the interlevel dielectric. CMP is applied to the surface of the conductive material to remove that surface to a level substantially commensurate with that of the upper surface of the interlevel dielectric. In this manner, interconnects that are isolated from each other by the interlevel dielectric are formed exclusively in the trenches. CMP can planarize only localized regions of the interconnect surface such that all interconnect traces have a co-planar upper surface, provided certain conditions are met. The localized area must contain trenches that are consistently and closely spaced from each other. Moreover, the trenches must be relatively narrow in lateral dimension. If those rather restrictive requirements are not met, then thicknesses of a given interconnect layer can vary to such a degree that local regions of interconnect may suffer severe current-carrying limitations.

In particular, planarization may become quite difficult in a region where there is a relatively large distance between a series of relatively narrow interconnect, or if there is a relatively wide interconnect such as that found in, for example, a bond pad or a wide conductive line, such as a bus. FIGS. 2–5 illustrate a typical damascene process and the localized thinning or "dishing" problem experienced by conventional metal CMP processes when a relatively wide interconnect is planarized.

FIG. 2 depicts a partial top view of a bond pad 22, possibly up to or exceeding 100 μm per side, formed in an interlevel dielectric 20 according to a conventional process. FIG. 3 shows a partial cross-sectional view of the semiconductor topography including the bond pad along line A. A relatively wide trench 24 is formed in interlevel dielectric 20 using well-known lithography and etch techniques. FIG. 4 illustrates a conductive material 28, e.g., a metal, such as aluminum, tungsten, tantalum, or titanium, deposited across the topography to a level spaced above upper surface 26. Due to the conformal nature of the sputter or CVD process used to apply the conductive material, the conductive material takes on an upper surface topography including a region 30 having a single wide valley area spaced above the wide trench 24 and a substantially flat region 32 spaced above smooth upper surface 26. Conductive material 28 is then polished, as shown in FIG. 5, using CMP to remove conductive material 28 from the upper surface of interlevel dielectric 20. As a result of CMP, a relatively wide interconnect 34 is formed exclusively in wide trench 24. As shown in FIG. 5, the wide interconnect 34 may subsequently function as a bond pad. A similar process may be used to form other wide interconnects, such as buses or other wide conductive lines.

Unfortunately, the topological surface of the interconnect level is not absent of elevational disparity. That is, the upper surface of interconnect 34 includes a recessed area 36 that extends below a substantially planar upper surface 38 of interlevel dielectric 20. Recessed area 36 may result from a phenomenon known as the "dishing" effect. Dishing naturally results from the polishing pad flexing or conforming to the surface being polished. If the surface being polished is initially bowed or arcuate (i.e., is not planar), the polishing pad will take on the shape of the non-planar regions causing further dishing of the surface being polished. The CMP slurry initiates the polishing process by chemically reacting with the surface material in both elevated and recessed areas. Because of the deformation of the CMP pad, the reacted surface material in recessed areas may be physically stripped in addition to the reacted surface material in elevated areas. As such, a surface having fluctuations in elevation may continue to have some elevational disparity even after it has been subjected to CMP. The dishing effect is particularly a problem when forming a relatively wide interconnect between regions of a dielectric that is substantially more dense than the metal. While the dielectric is hard enough to support the overlying regions of the CMP pad, the metal is not, and thus allows significant flexing of the pad. Such flexing of the CMP pad may cause the surface of the metal interconnect to become recessed relative to adjacent regions of the dielectric.

It would therefore be desirable to develop a polishing process which can achieve global planarization across the entire topological surface of an interconnect level. Global planarization requires that the polish rate be uniform in all elevated areas of the topography. Such uniformity of the polish rate is particularly needed when polishing a topography having a relatively wide interconnect, a wide interconnect interspersed with other wide interconnects, or a wide interconnect interspersed with densely spaced or sparsely spaced narrow (or "small") interconnects. The desired polishing process must avoid problems typically arising during CMP of varying metal substrate area, such as metal dishing.

SUMMARY OF THE INVENTION

The problems outlined above are in large part solved by an embodiment of the present invention in which a substantially planar semiconductor topography is fabricated by forming a plurality of posts in a dielectric layer in a region defined by a relatively wide interconnect. The dielectric layer may include a material having a relatively low dielectric constant such as a glass- or silicate-based dielectric, preferably silicon dioxide.

According to an embodiment, trenches are first etched in the dielectric layer to form a plurality of posts surrounded by the trenches. The widths, lengths, and depths of the trenches and the widths of the posts may vary according to design preferences and criteria. In an embodiment in which a bond pad is to be formed, both the trenches and the posts may have widths of about 10 $\mu$m. In an alternative embodiment, the trenches may have a width of about 9 $\mu$m and the posts may have a width of about 1 $\mu$m. The overall length (lateral dimension) of the etched area is preferably between about 75 $\mu$m and about 100 $\mu$m. The depth of the trenches is preferably greater than about 0.2 $\mu$m. According to an embodiment in which a wide conductive line such as, e.g., a power or ground conductor within a bus is to be formed, the conductive line may have a width of at least about 5 $\mu$m and the posts may have a width of at least about 1 $\mu$m. The depth of the trenches is preferably greater than about 0.2 $\mu$m.

The trenches are filled with a conductive material, e.g., a metal or an alloy of a metal such as aluminum, copper, tungsten, molybdenum, tantalum, or titanium. The conductive material is preferably deposited to a level spaced above the upper surface of the dielectric layer. The surface of the conductive material is then polished to a level substantially coplanar with the level of the upper surfaces of the dielectric layer and the posts. Advantageously, the polish rate of the conductive material above the trenches and the posts is substantially uniform. The posts preferably serve to improve the planarization of the conductive material surrounding them.

In one embodiment, the conductive material may be polished using well-known CMP. That is, the front side of the semiconductor topography may be forced against a CMP polishing pad while the polishing pad and the topography are rotated relative to each other. A CMP slurry entrained with abrasive particles, e.g., ceria, silica, or alumina, may be dispensed upon the polishing pad surface to aid in the removal of the conductive material. In an alternate embodiment, a "fixed-abrasive" technique may be used to polish the conductive material. The fixed-abrasive technique involves placing a liquid that is substantially free of particulate matter between the surface of the conductive material and an abrasive polishing surface of a polishing pad. The fixed abrasive technique avoids liquids that contain chemical constituents that could react with the topography. The abrasive polishing surface is moved relative to the semiconductor topography so as to polish the conductive material. The liquid applied to the polishing surface preferably comprises deionized water, however, other liquids which have a near-neutral pH value may alternatively be directed onto the fixed abrasive polishing surface. The pH that is chosen for the polishing process is one suitable for the conductive material and the polishing pad. The polishing surface may include a polymer-based matrix entrained with particles selected from the group consisting of cerium oxide, cerium dioxide, aluminum oxide, silicon dioxide, titanium oxide, chromium oxide, and zirconium oxide.

The abrasive polishing surface preferably belongs to a polishing pad which is substantially resistant to deformation even when placed across an elevationally recessed region of relatively large lateral dimension (e.g., over 200 $\mu$m lateral dimension). Therefore, the pad is preferably relatively non-conformal to the underlying surface and thus does not come in contact with elevationally recessed regions of the conductive material. It is believed that particles dispersed throughout the abrasive polishing surface in combination with the polishing liquid interact chemically and physically with elevated regions of the conductive material to remove those regions. However, the liquid alone may be incapable of removing the conductive material in elevationally recessed regions. As such, elevationally raised regions of the conductive material may be removed at a substantially faster rate than elevationally recessed regions. The polish rate preferably slows down significantly as the topological surface of the interconnect level approaches planarity.

Whatever polishing technique is applied to the conductive material, the presence of the posts within the conductive material preferably provides for global planarization of the topography employing the posts. It is theorized that the dielectric material of the posts, being denser than the conductive material, causes the polishing pad to remain substantially flat when pressure is applied thereto. That is, the surface area of the dielectric protrusions within the conductive material is not sufficient to withstand the force of the polishing pad, and thus does not cause the pad to flex. Therefore, dishing of the conductive material in the large area metal-filled trenches (e.g., bond pads greater than about 75 μm per side or interconnects greater than about 5 μm wide) is less likely to occur as a result of the polishing process.

The conductive material may continue to be polished more rapidly than the dielectric once the surface of the conductive material has been removed to the same elevational plane as the dielectric. The dielectric protrusions within the conductive material may thus become elevated above the conductive material. Consequently, the entire topological surface of the bond pad may have surface disparities, causing the polish rate of the elevated dielectric protrusions to become greater than that of the recessed conductive material. As the polishing process continues, the dielectric protrusions are again made substantially coplanar with the conductive material. This cycle may be repeated until it is desirable to stop the polishing process.

BRIEF DESCRIPTION OF THE DRAWINGS

Other objects and advantages of the invention will become apparent upon reading the following detailed description and upon reference to the accompanying drawings in which.

Figure 1:
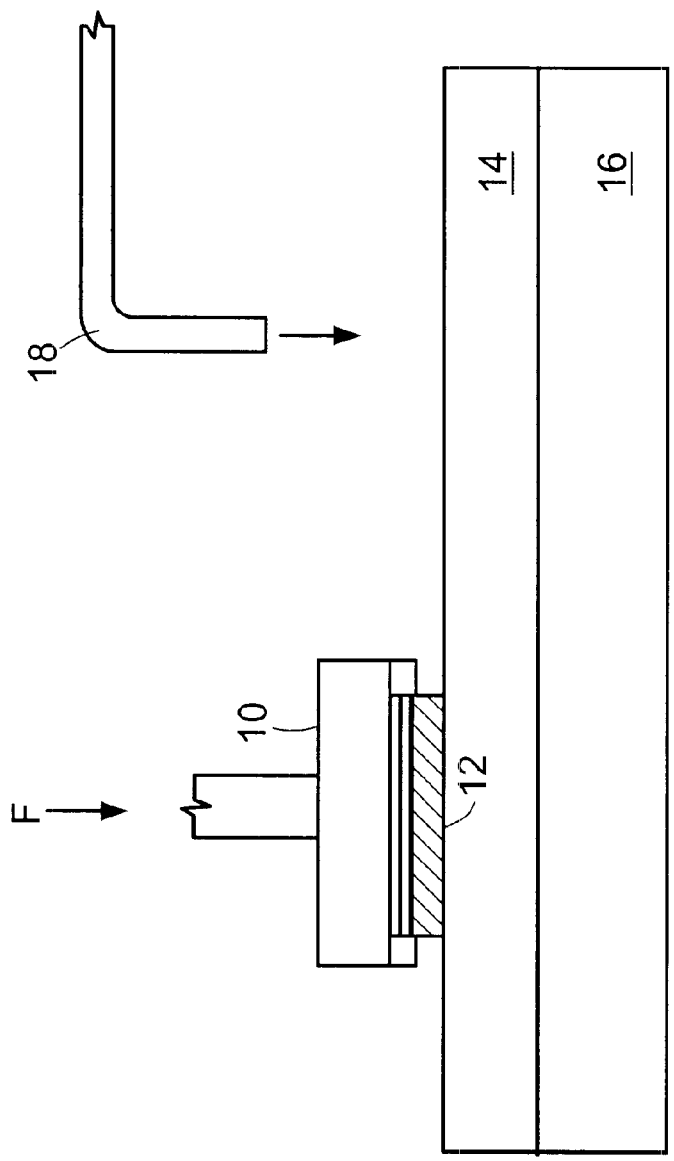
FIG. 1 depicts a side plan view of an apparatus that may be used to chemical-mechanical polish a semiconductor topography.
Figure 2:
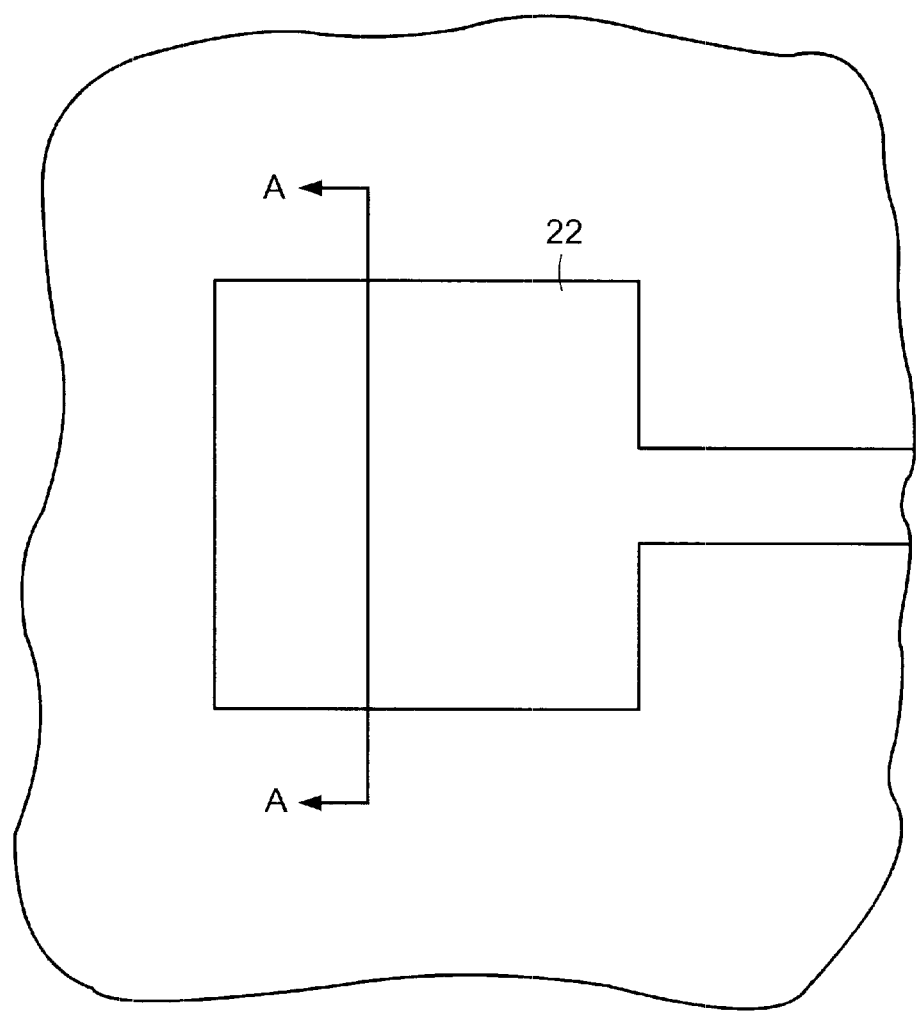
FIG. 2 depicts a partial top view of a conventional semiconductor topography including a bond pad.
Figure 3:
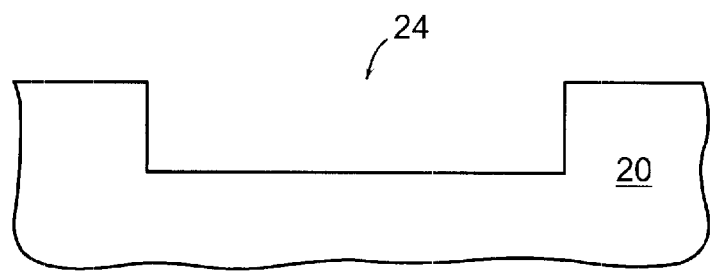
FIG. 3 depicts a partial cross-sectional view of the semiconductor topography, wherein a relatively wide trench is formed within an interlevel dielectric.
Figure 4:
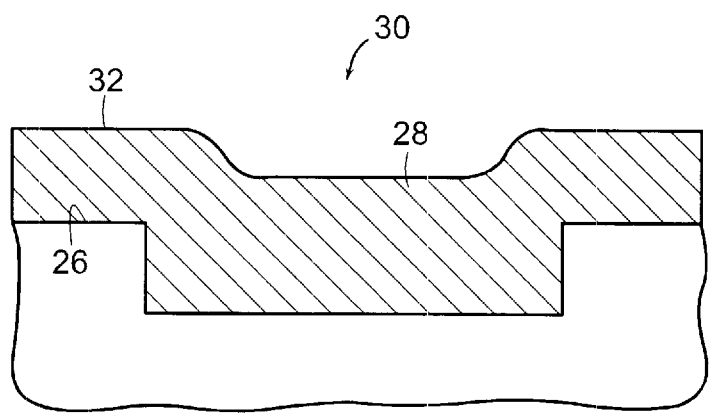
FIG. 4 depicts a partial cross-sectional view of the semiconductor topography, wherein a conductive material is deposited into the trench to a level spaced above an upper surface of the interlevel dielectric.
Figure 5:
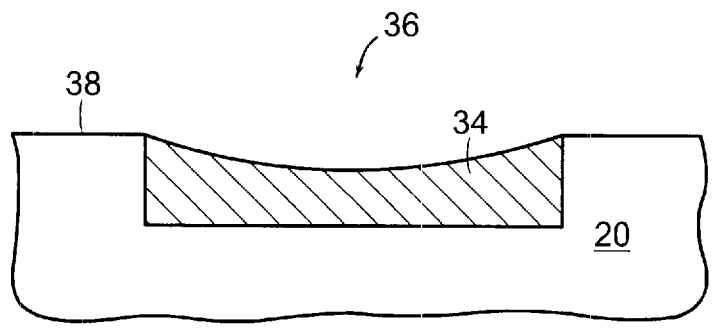
FIG. 5 depicts a partial cross-sectional view of the semiconductor topography, wherein the surface of the conductive material is removed from the upper surface of the interlevel dielectric using a conventional CMP technique, thereby forming a topological surface having elevational disparities.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 6:
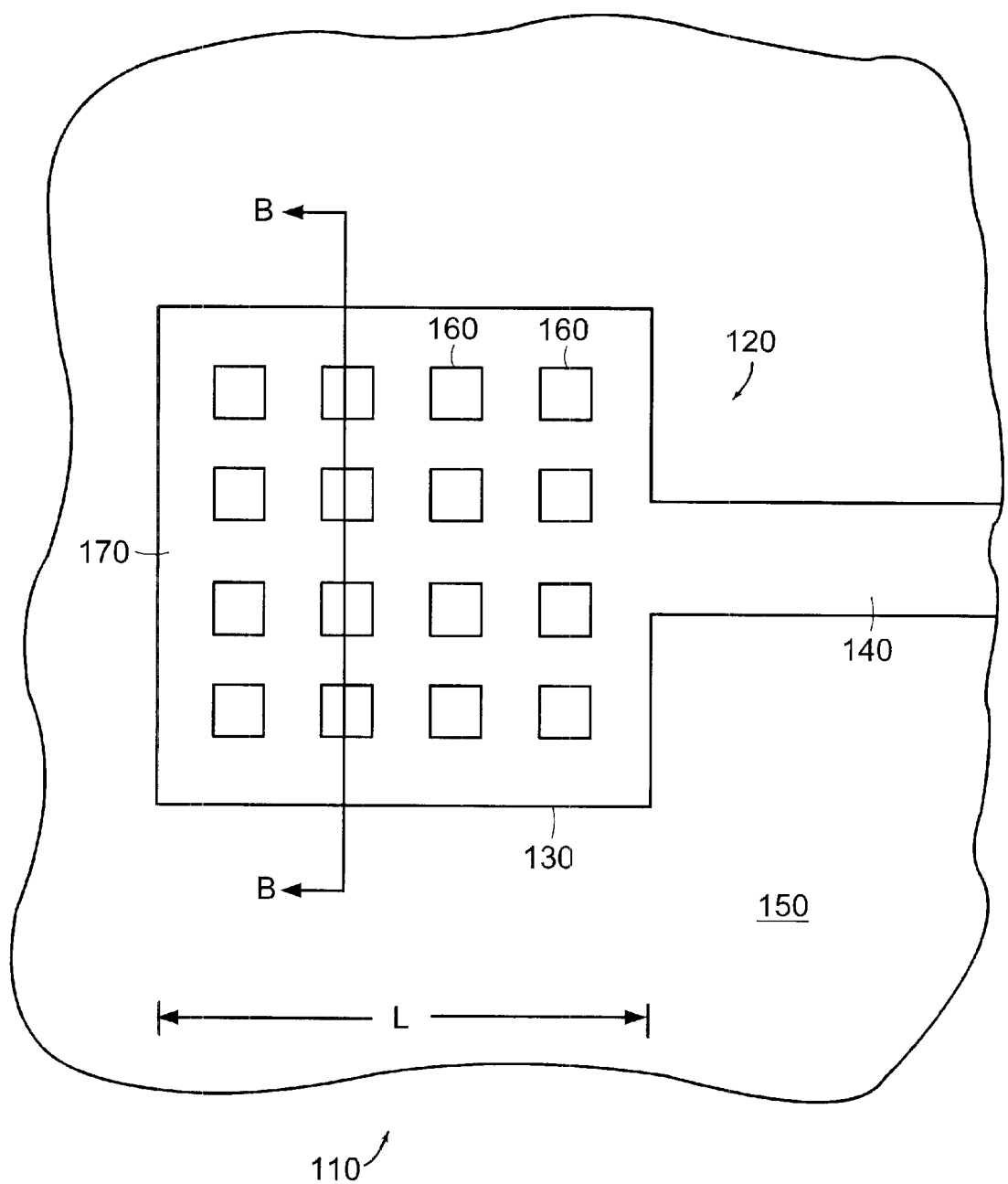
FIG. 6 depicts a partial top view of a semiconductor topography according to an embodiment of the present invention, including a bond pad having a plurality of dielectric posts surrounded by a conductive material.

Turning to FIG. 6, a partial top view of an embodiment of semiconductor topography is presented. Electrically conductive features may be embodied within the topography. As depicted in FIG. 6, semiconductor topography 110 includes a wide interconnect structure 120 formed within a dielectric layer 150. Wide interconnect structure 120 includes bond pad 130 and bus line 140. Bond pad 130 includes conductive portion 170 surrounding a plurality of dielectric posts 160.

Figure 7:
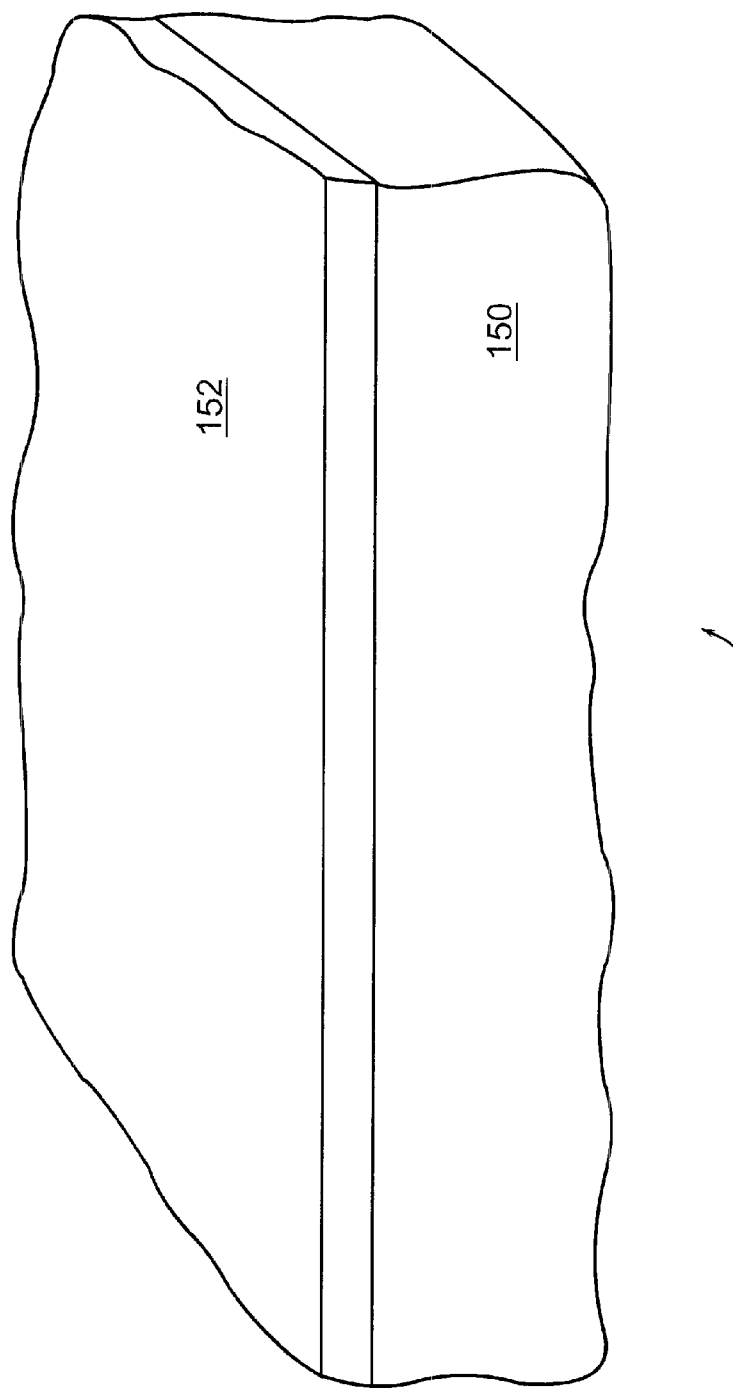
FIG. 7 depicts a partial perspective view of the semiconductor topography, wherein a photoresist layer is formed above a dielectric layer.

FIG. 7 shows a partial perspective view of the semiconductor topography 110 of FIG. 6 along line B prior to formation of posts 160. According to an embodiment of a method for forming wide interconnect structure 120, a layer of photoresist 152 may be deposited upon dielectric layer 150 and selectively patterned. Dielectric layer 150 may include a dielectric material having a relatively low dielectric constant. Dielectric layer 150 may include, e.g., a glass- or silicate-based material, such as an oxide that has been deposited by chemical-vapor deposition ("CVD") from either a tetraethyl orthosilicate ("TEOS") source or a silane source and doped with an impurity, e.g., boron or phosphorus. Dielectric layer 150 may serve as a poly-metal interlevel dielectric ("PMD") between a doped polycrystalline silicon ("polysilicon" or "poly") gate layer and an ensuing metal interconnect layer. It is to be understood that the gate layer may include other conductive materials besides polysilicon. Alternatively, dielectric 150 may form an inter-metal interlevel dielectric ("IMD") between an underlying metal interconnect layer and an ensuing overlying metal interconnect layer.

Figure 8:
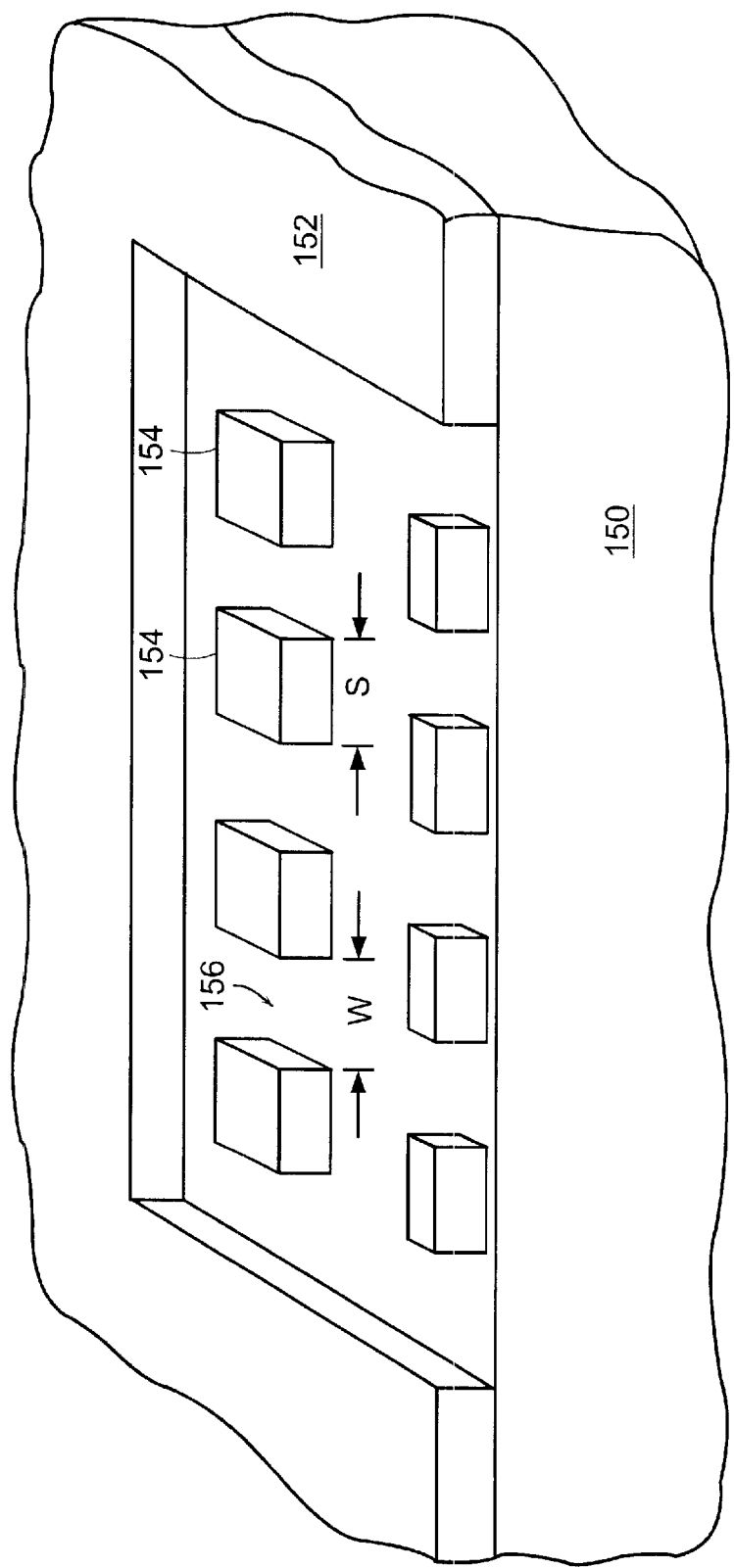
FIG. 8 depicts a partial perspective view of the semiconductor topography, wherein the photoresist is lithographically patterned.

Photoresist 152 may be lithographically patterned as shown in FIG. 8 to expose select portions 156 of the dielectric 150. The patterning of the photoresist may leave retained photoresist portions 154 having a width S upon dielectric layer 150 and separated from each other by a distance W. For example, in an embodiment, S may be about 10 $\mu$m and W may be about 10 $\mu$m. According to an alternative embodiment, S may be about 1 $\mu$m and W may be about 9 $\mu$m. Photoresist 152 may be removed from dielectric layer 150 over an area having a total width L (see FIG. 6) in which bond pad 130 is to be formed. In an embodiment, L may be between about 75 $\mu$m and about 125 $\mu$m.

Figure 9:
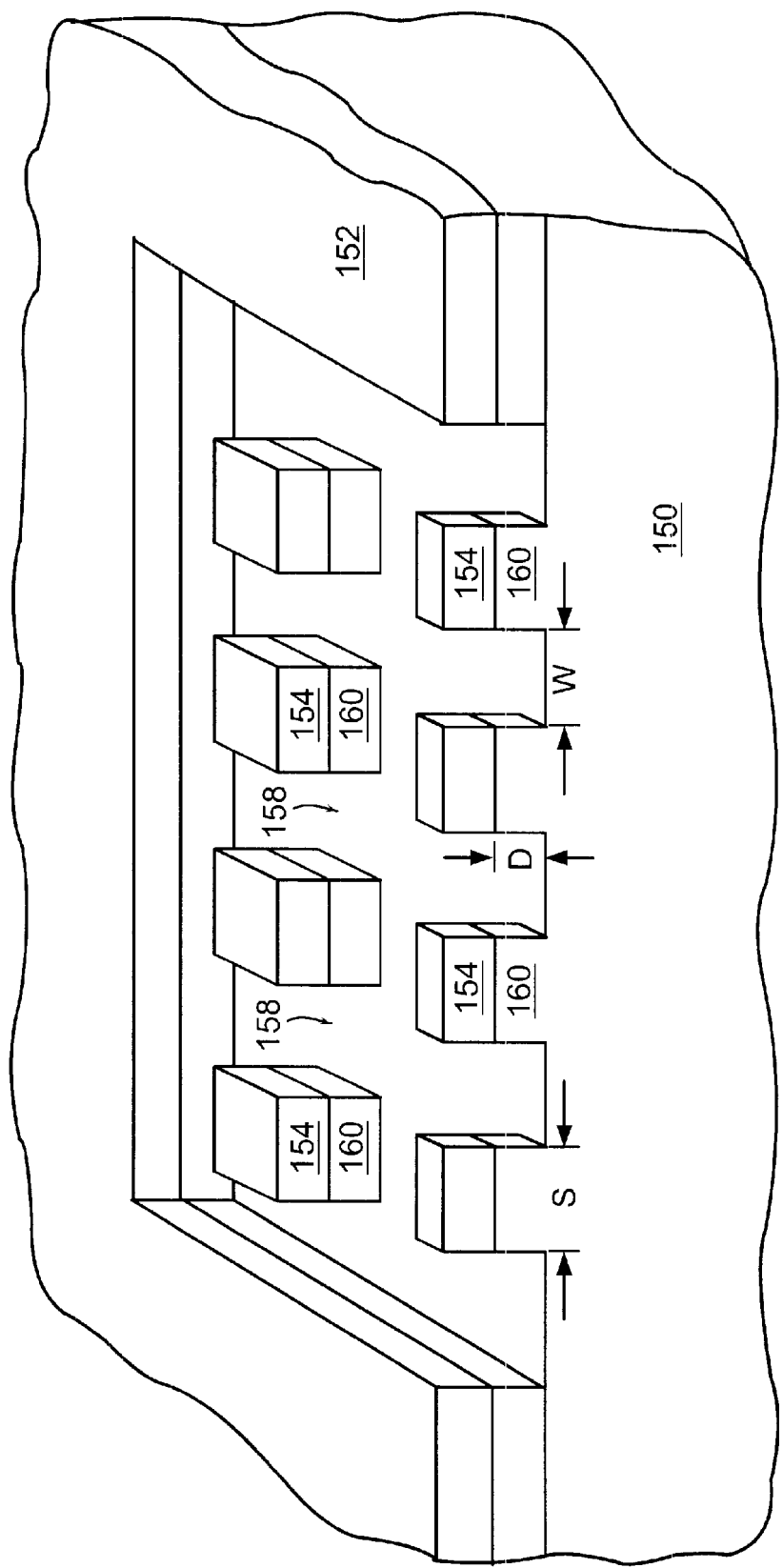
FIG. 9 depicts a partial perspective view of the semiconductor topography, wherein the dielectric layer is selectively etched to form a plurality of dielectric posts surrounded by trenches.
Figure 10:
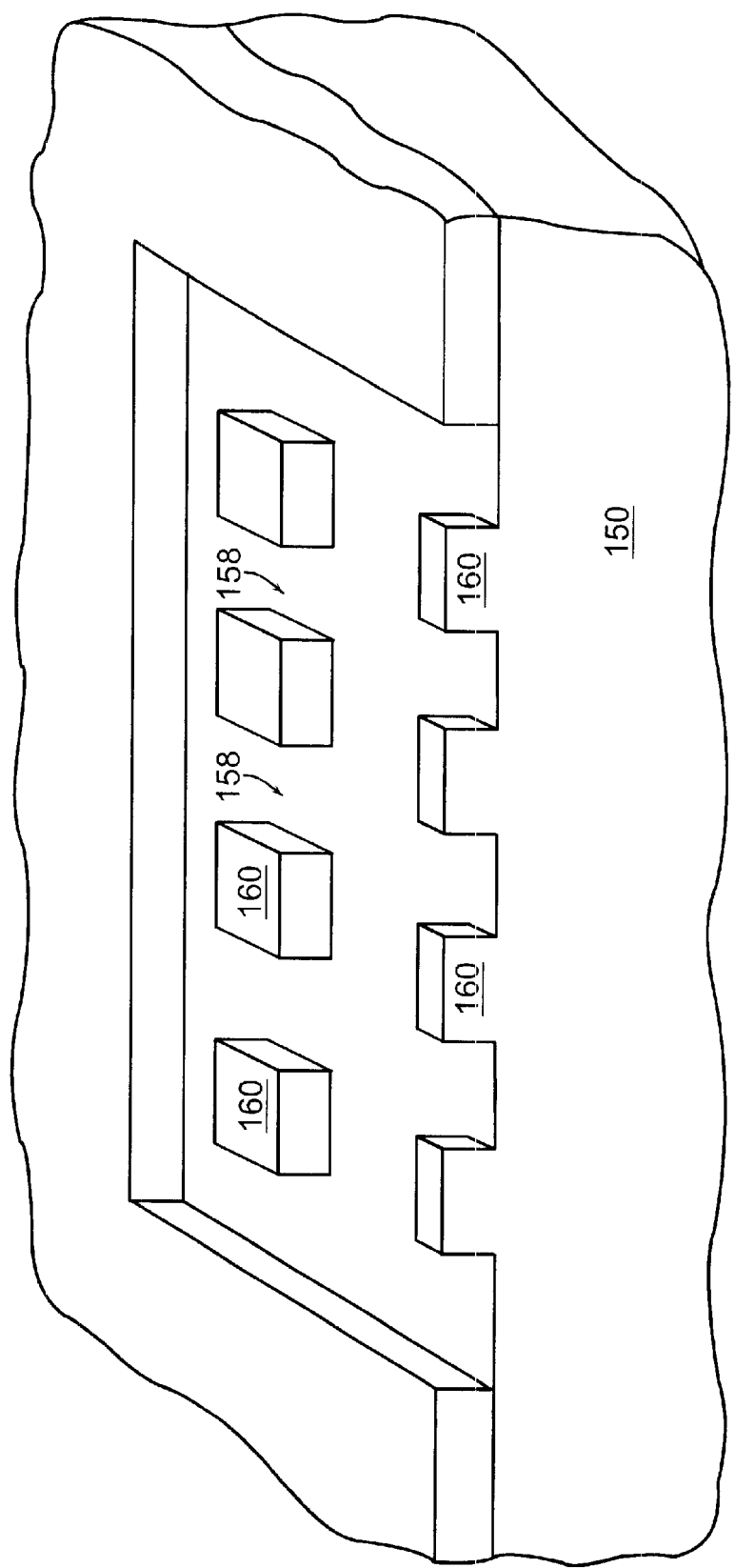
FIG. 10 depicts a partial perspective view of the semiconductor topography, wherein the photoresist is removed from upon the dielectric layer.

The select portions 156 of dielectric layer 150 not covered by the patterned photoresist 154 may then be etched using an etch technique such as a $CF_4$ plasma etch, as shown in FIG. 9, followed by removal of the patterned photoresist, as shown in FIG. 10. The etching preferably forms trenches 158 having a depth D and a width W within dielectric layer 150. According to an exemplary embodiment, depth D may be between about 0.2 $\mu$m and about 1.0 $\mu$m. Portions of dielectric layer 150 masked by patterned photoresist 154 may be retained and may form posts 160 of width S. Following the etching, photoresist 154 may be removed from upon dielectric layer 150, as shown in FIG. 10. It should be noted that although bond pad 130 and posts 160 are depicted in FIG. 6 as having a substantially square shape, bond pad 130 and posts 160 may have a variety of topological shapes such as, but not limited to, rectangular, circular, or hexagonal. It should be further noted that although widths S and W are depicted as uniform across the semiconductor topography, trenches and posts of varying dimensions may be formed.

Figure 11:
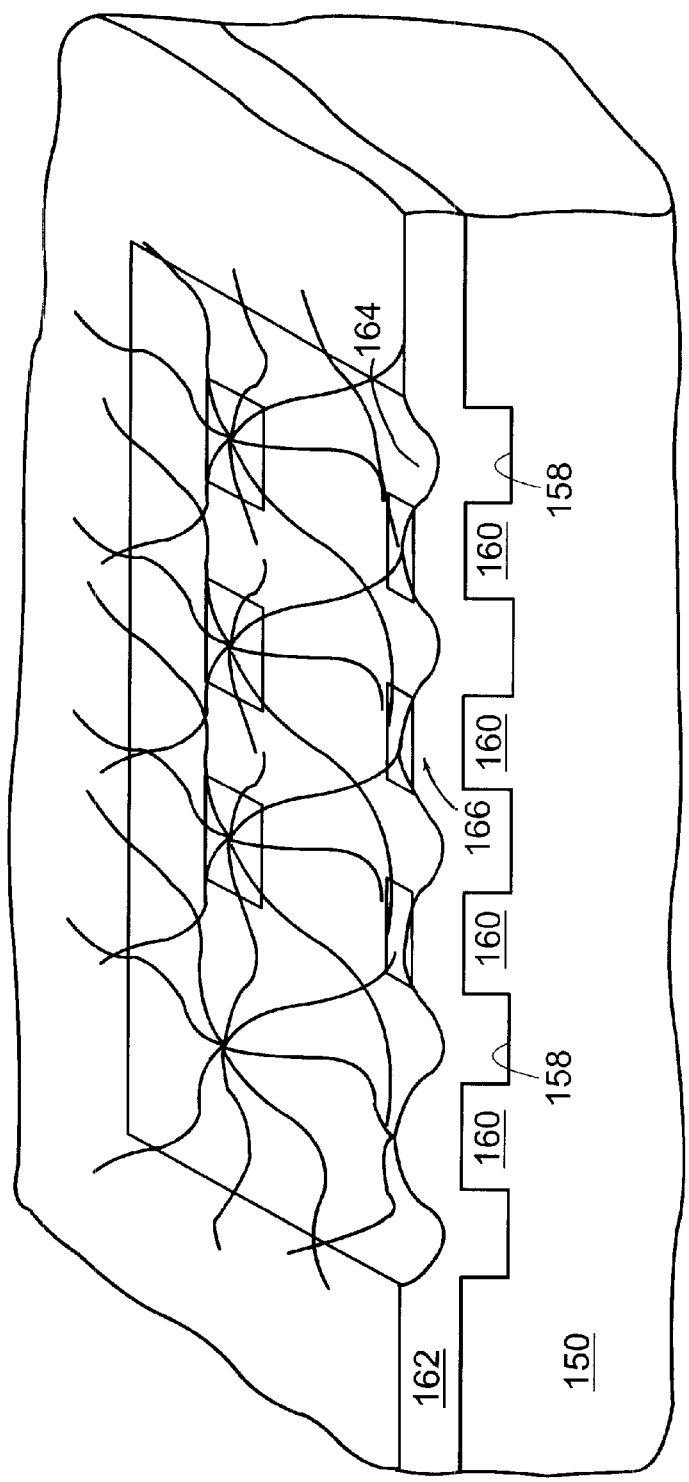
FIG. 11 depicts a partial perspective view of the semiconductor topography, wherein a conductive material is deposited into the trenches to a level spaced above the upper surfaces of the dielectric layer and the posts.

Turning now to FIG. 11, a layer of conductive material may be deposited across the semiconductor topography, preferably to a level spaced above the uppermost horizontal surface of dielectric layer 150 and posts 160. Conductive material 162 may include a metal such as aluminum, copper, tungsten, molybdenum, tantalum, titanium, or alloys thereof. Such a metal may be sputter deposited from a metal target or MOCVD (i.e., metal organic CVD) deposited from a metal organic source. The as-deposited conductive material 162 may have an elevationally disparate surface, with valley areas 164 directly above trenches 158 and hill areas 166 directly above posts 160 between the trenches.

Figure 12:
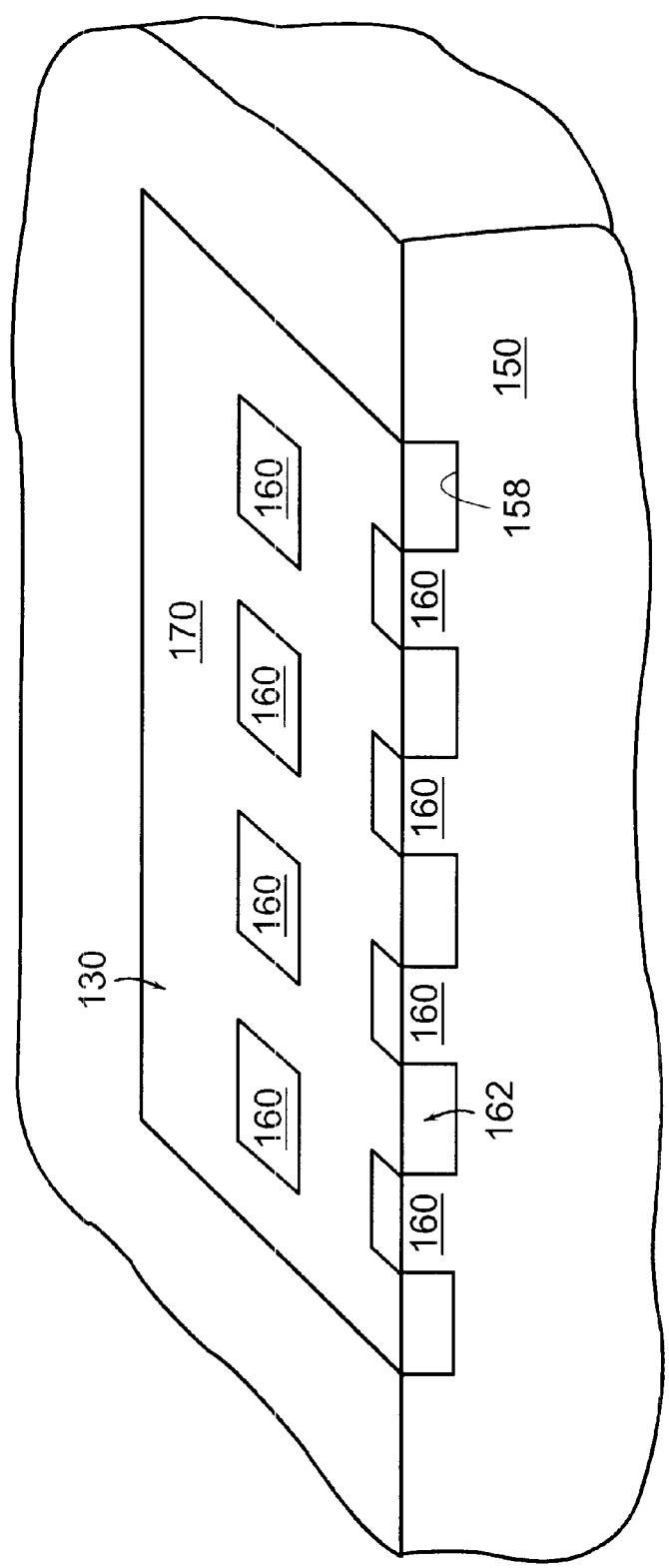
FIG. 12 depicts a partial perspective view of the semiconductor topography, wherein the surface of the conductive material is removed to a level substantially commensurate with that of the upper surfaces of the dielectric layer and the posts using a planarization process according to an embodiment of the present invention, thereby forming a planarized topological surface.

Turning now to FIG. 12, conductive material 162 may be polished to a level substantially coplanar with the uppermost surface of dielectric layer 150 and posts 160. As a result of polishing conductive material 162, conductive portion 170 of bond pad 130 is formed in trenches 158. Placing posts 160 between the series of trenches 158 affords global planarization of the topological surface. That is, the polish rate is substantially uniform across the entire topological surface. Also, the polish rate of elevationally raised regions is greater than that of elevationally recessed regions. Further, a surface having elevational disparity is polished at a faster rate than a substantially flat surface.

It is believed that the presence of posts 160 helps prevent the polishing pad from deforming about the length of the pad when the pad is subjected to normal pressure, as may occur when polishing a relatively wide trench. Further, it is postulated that posts 160 ensure that elevational fluctuations are present in different regions of the topological surface at the same time. That is, no particular region of the topological surface becomes substantially planarized before other regions and thereby causes fluctuations in the polish rate across the surface. Thus, the polish rate does not slow down until the entire topological surface is substantially free of elevational disparity.

Figure 13:
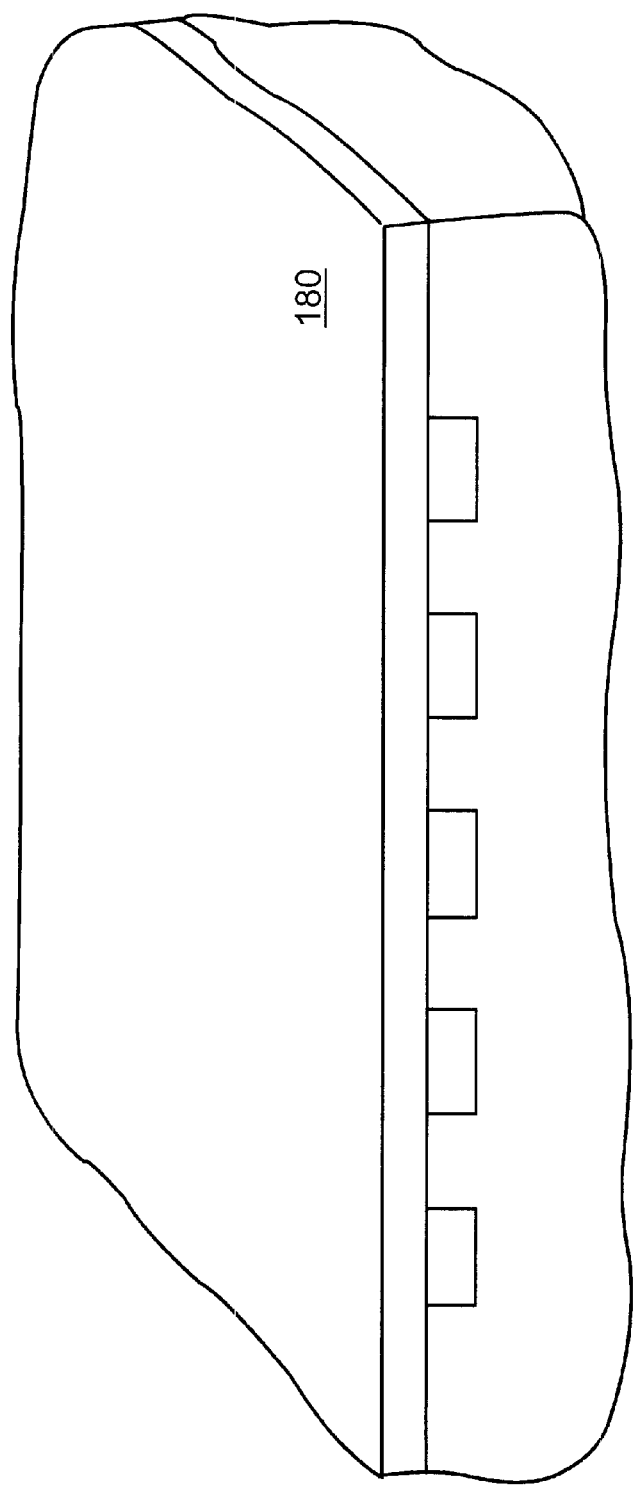
FIG. 13 depicts a partial perspective view of the semiconductor topography, wherein a passivation layer is formed according to one embodiment across the upper surfaces of the conductive material, the dielectric layer, and the posts.
Figure 14:
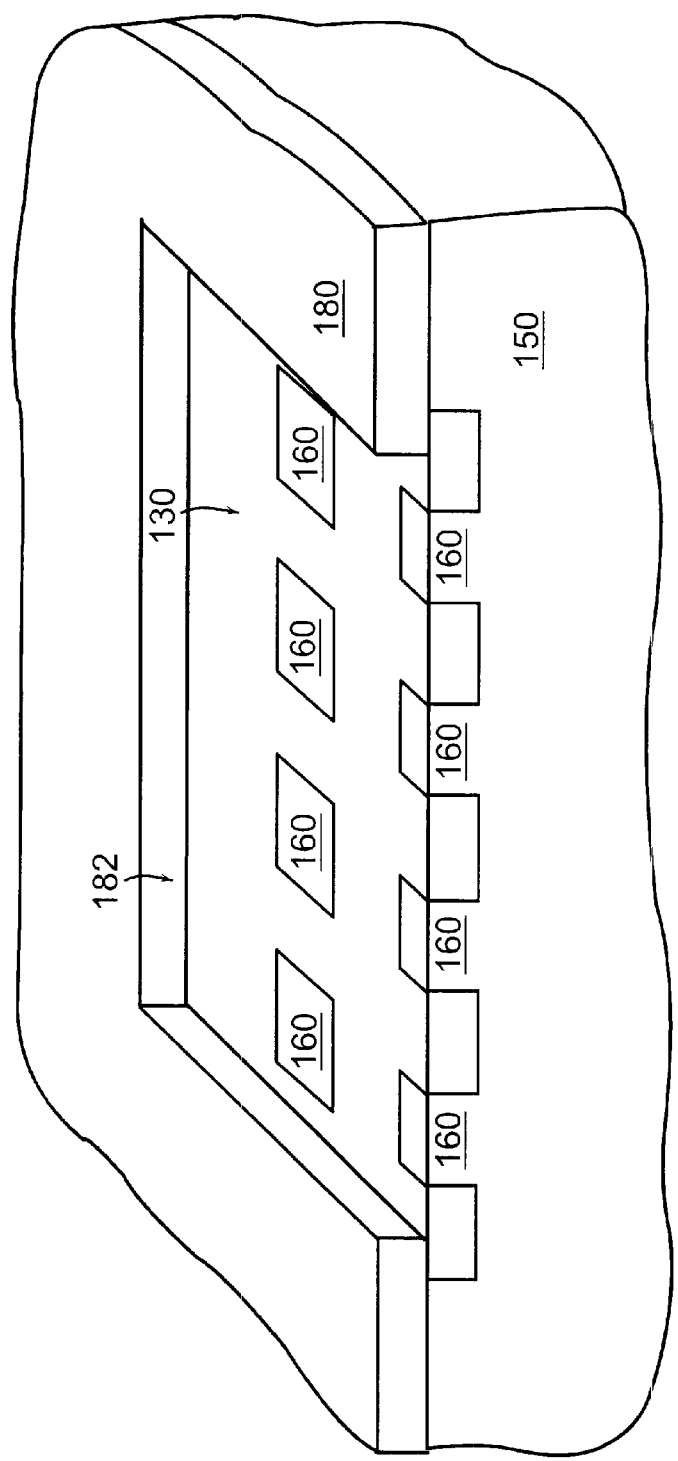
FIG. 14 depicts a partial perspective view of the semiconductor topography, wherein a contact window is formed by removing a portion of the passivation layer from above the conductive material.

Following the formation of bond pad 130, a passivation layer may be formed upon the semiconductor topography, as shown in FIG. 13. Passivation layer 180 may seal out moisture and contaminants and protect the underlying structures from scratches. In an embodiment, passivation layer 180 may include a dielectric material. The dielectric material may include, for example, a CVD phosphosilicate glass or a plasma-enhanced silicon nitride. An opening 182 may be formed in passivation layer 180 to expose portions of bond pad 130, as shown in FIG. 14. Wires may be connected to metal 170 of bond pad 130 and to a chip package (not shown) to establish connections from the chip to the package leads.

Figure 15:
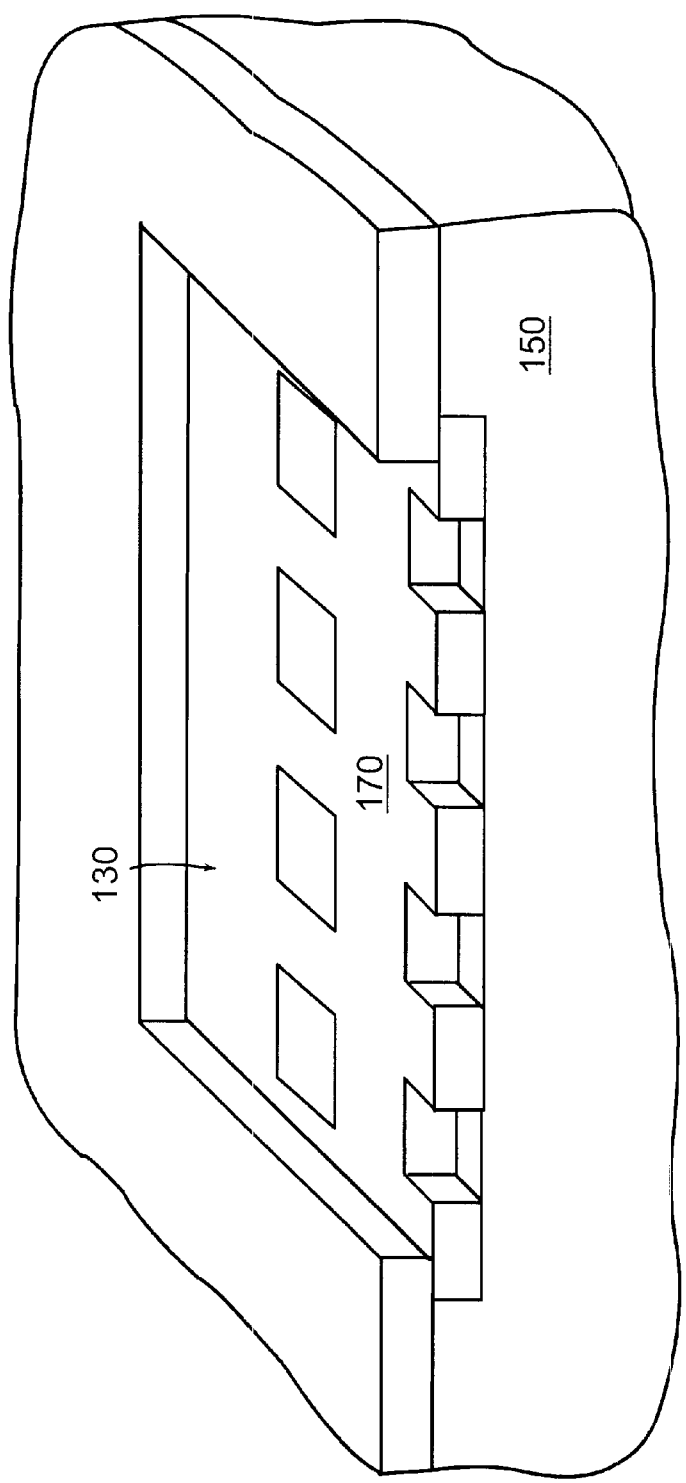
FIG. 15 depicts a partial perspective view of the semiconductor topography, wherein a portion of the posts are removed from within the conductive material exposed by the contact window.

Opening 182 maybe formed using a photolithography process similar to the process described for forming posts 160 and trenches 158 (FIGS. 8–9). In an embodiment, the etchant used to remove patterned portions of passivation layer 180 may also remove posts 160 from within conductive portion 170, as shown in FIG. 15. As such, when a wire is connected to bond pad 130, the connection preferably will be only to conductive portion 170 and not to a dielectric portion such as posts 160.

Figure 16:
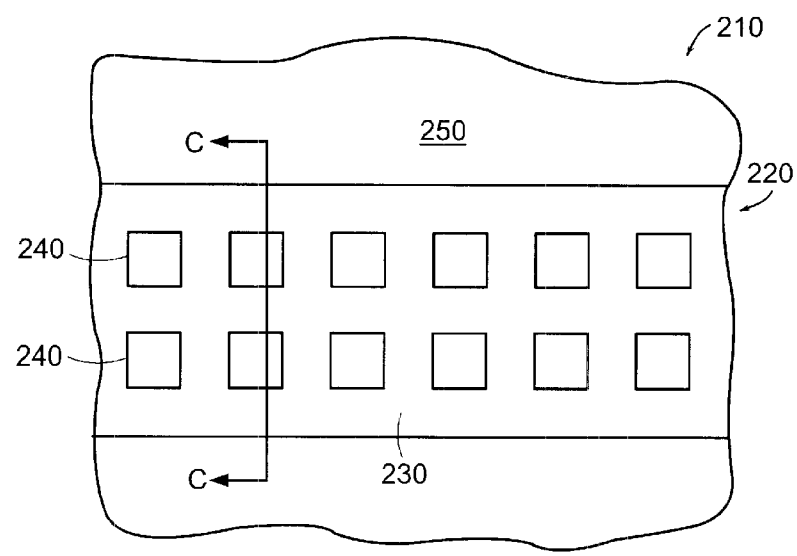
FIG. 16 depicts a partial top view of a semiconductor topography according to an alternative embodiment of the present invention, including a wide conductive line having a plurality of dielectric posts surrounded by a conductive material.
Figure 17:
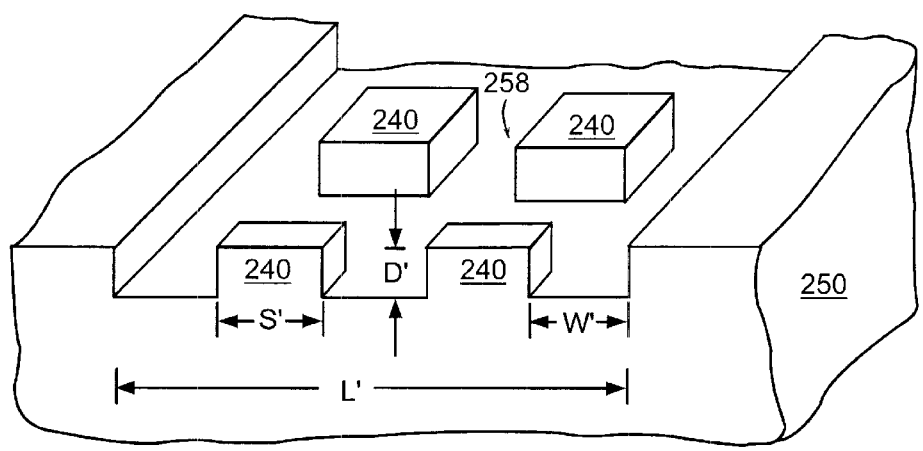
FIG. 17 depicts a partial perspective view of the semiconductor topography, wherein a dielectric layer is selectively etched to form a plurality of dielectric posts surrounded by trenches.

FIG. 16 depicts a partial top view of an alternative embodiment of a semiconductor topography. As depicted in FIG. 16, semiconductor topography 210 includes a wide conductive line 220 formed within a dielectric layer 250. Wide conductive line 220 includes conductive portion 230 surrounding a plurality of dielectric posts 240. FIG. 17 shows a partial perspective view of the semiconductor topography 210 of FIG. 16 along line C. According to an embodiment of a method for forming wide conductive line 220, a layer of photoresist may be deposited upon dielectric layer 250 and selectively patterned as described previously with respect to FIG. 8. Dielectric layer 250 may include a dielectric material having a relatively low dielectric constant and serve as a PMD or IMD as previously described.

The photoresist may be lithographically patterned and trenches may be formed in dielectric material 250 according to a procedure similar to the method described with respect to FIGS. 8–10. Trenches 258 having a depth D' and a width W' are preferably formed within dielectric layer 250. Portions of dielectric layer 250 not removed during trench formation may form posts 240 of width S'. According to an exemplary embodiment, in which the width L' of the wide conductive line is at least about 5 $\mu$m, widths W' and S' may be at least about 1 $\mu$m and depth D' may be at least about 0.2 $\mu$m. It should be noted that although posts 240 are depicted in FIG. 17 as having a substantially square shape, posts 240 may have a variety of shapes such as, but not limited to, rectangular, circular, or hexagonal. It should be further noted that although widths S' and W' are depicted as uniform across the semiconductor topography, trenches and posts of varying dimensions may be formed.

Figure 18:
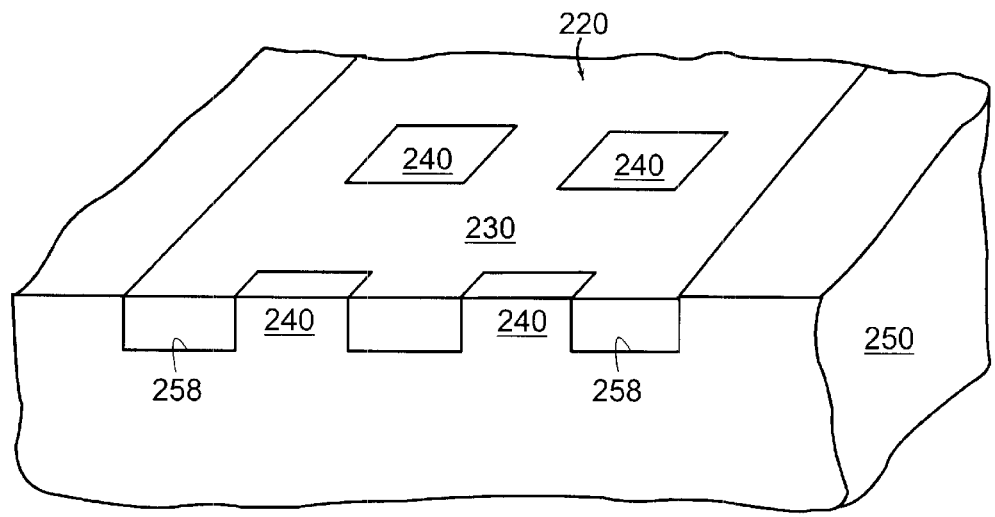
FIG. 18 depicts a partial perspective view of the semiconductor topography, wherein a conductive material is deposited into the trenches and wherein the surface of the conductive material is removed to a level substantially commensurate with that of the upper surfaces of the dielectric layer and the posts using a planarization process according to an embodiment of the present invention, thereby forming a planarized topological surface.

A layer of conductive material (similar to layer 162 shown in FIG. 11) may be deposited across the semiconductor topography, preferably to a level spaced above the uppermost horizontal surface of dielectric layer 250 and posts 240. The conductive material may be polished to a level substantially coplanar with the uppermost surface of dielectric layer 250 and posts 240, as shown in FIG. 18, to form conductive portion 230 of wide conductive line 220 in trenches 258. Placing posts 240 between the series of trenches 258 affords global planarization of the topological surface as previously described.

Figure 19:
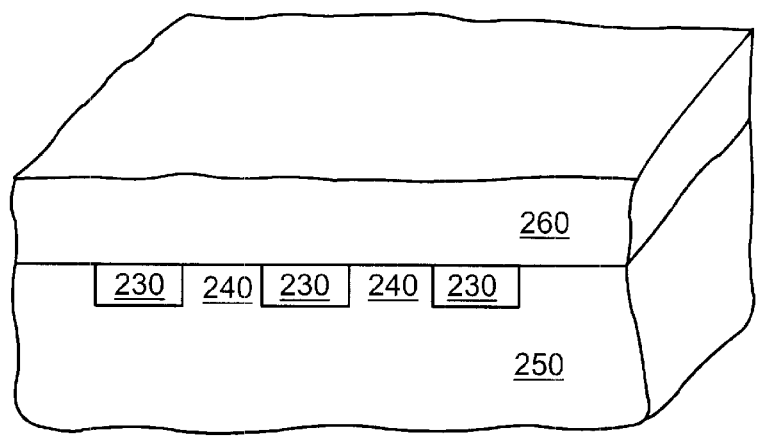
FIG. 19 depicts a partial perspective view of the semiconductor topography, wherein an additional dielectric layer is formed upon the semiconductor topography.

Following the formation of wide conductive line 220, an additional interlevel dielectric 260 may be formed upon the semiconductor topography, as shown in FIG. 19. Additional interlevel dielectric 260 may include, e.g., a glass- or silicate-based material, such as an oxide that has been deposited by chemical-vapor deposition ("CVD") from either a tetraethyl orthosilicate ("TEOS") source or a silane source and doped with an impurity, e.g., boron or phosphorus. Dielectric 250 may form an interlevel dielectric between wide conductive line 220 and an ensuing overlying interconnect layer.

It will be appreciated to those skilled in the art having the benefit of this disclosure that this invention is believed to provide a method for forming a substantially planar semiconductor topography by placing a plurality of dielectric posts within a relatively wide interconnect such as a bond pad or wide conductive line. Further modifications and alternative embodiments of various aspects of the invention will be apparent to those skilled in the art in view of this description. For example, electrically conductive features isolated from each other by a dielectric may subsequently be formed upon the planarized semiconductor topography. It is intended that the following claims be interpreted to embrace all such modifications and changes and, accordingly, the specification and drawings are to be regarded in an illustrative rather than a restrictive sense.

What is claimed is:

1. A method for forming a semiconductor topography having a substantially planar electrically conductive feature, comprising:

forming a trench within a region of a dielectric layer to form from said dielectric layer a plurality of posts within said trench;

filling said trench with a conductive material;

planarizing an upper surface of said conductive material to an elevational level commensurate with an upper surface of said dielectric layer;

forming a passivation layer upon the conductive material and the dielectric layer; and removing portions of the passivation layer to form an opening above a portion of the conductive material, wherein the opening exposes an entirety of the plurality of posts.

2. The method as recited in claim 1, wherein forming said trench comprises:

depositing a layer of photoresist upon said dielectric layer;

patterning said photoresist;

removing said photoresist from first regions of said dielectric layer where said trench is to be formed while retaining said photoresist upon second regions of said dielectric layer from which said posts are to be formed; and removing a portion of said dielectric layer from said first regions to form said trench while retaining said dielectric layer in said second regions.

3. The method as recited in claim 1, wherein filling said trench with a conductive material comprises depositing a metal.

4. The method as recited in claim 3, wherein said metal is selected from the group consisting of aluminum, copper, tungsten, molybdenum, tantalum, titanium, and alloys thereof.

5. The method as recited in claim 1, wherein said planarizing comprises chemical-mechanical polishing.

6. The method as recited in claim 1, further comprising forming an interlevel dielectric layer upon said conductive material and said dielectric material.

7. The method as recited in claim 1, wherein said region comprises a bond pad.

8. The method as recited in claim 1, wherein said dielectric layer comprises a glass-based material.

9. The method as recited in claim 1, wherein the posts extend from a floor of the trench.

10. The method as recited in claim 1, wherein a first width of at least one of the posts is at least one micron.

11. The method as recited in claim 10, wherein a second width, along a direction perpendicular to the first width, of the at least one of the posts is at least one micron.

12. The method as recited in claim 10, wherein the first width of each of the posts is at least one micron.

13. The method as recited in claim 12, wherein a second width, along a direction perpendicular to the first width, of each of the posts is at least one micron.

14. A method for forming a semiconductor topography having a substantially planar electrically conductive feature, comprising:

forming a trench within a region of a dielectric layer to form from said dielectric layer a plurality of posts within said trench;

filling said trench with a conductive material;

planarizing an upper surface of said conductive material to an elevational level commensurate with an upper surface of said dielectric layer;

forming a passivation layer upon the conductive material and the dielectric layer;

removing portions of the passivation layer to form an opening above a portion of the conductive material; and removing posts exposed by the opening.

15. The method as recited in claim 14, wherein the opening exposes an entirety of the plurality of posts.

16. The method as recited in claim 14, wherein said removing posts is performed subsequent to said removing portions of the passivation layer.

17. The method as recited in claim 14, wherein said removing posts and removing portions of the passivation layer are performed in a single etch process.

18. A method for forming a semiconductor topography having a substantially planar electrically conductive feature, comprising:

forming a trench within a region of a dielectric layer to form from said dielectric layer a plurality of posts within said trench;

filling said trench with a conductive material;

planarizing an upper surface of said conductive material to an elevational level commensurate with an upper surface of said dielectric layer; and removing said posts subsequent to said filling.

* * * * *